(12) United States Patent
Seon et al.

(10) Patent No.: US 8,829,515 B2
(45) Date of Patent: Sep. 9, 2014

(54) TRANSISTOR HAVING SULFUR-DOPED ZINC OXYNITRIDE CHANNEL LAYER AND METHOD OF MANUFACTURING THE SAME

(71) Applicant: Samsung Electronics Co., Ltd., Suwon-Si (KR)

(72) Inventors: Jong-baek Seon, Yongin-si (KR); Tae-sang Kim, Seoul (KR); Hyun-suk Kim, Hwaseong-si (KR); Myung-kwan Ryu, Yongin-si (KR); Joon-seok Park, Seongnam-si (KR); Seok-jun Seo, Anyang-si (KR); Kyoung-seok Son, Seoul (KR); Sang-yoon Lee, Seoul (KR)

(73) Assignees: Samsung Electronics Co., Ltd., Gyeonggi-do (KR); Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/721,635

(22) Filed: Dec. 20, 2012

(65) Prior Publication Data
US 2013/0306966 A1 Nov. 21, 2013

(30) Foreign Application Priority Data
May 16, 2012 (KR) .................. 10-2012-0052212

(51) Int. Cl.
*H01L 29/06* (2006.01)
*H01L 29/22* (2006.01)
*H01L 29/786* (2006.01)
*H01L 29/36* (2006.01)

(52) U.S. Cl.
CPC .......... *H01L 29/2206* (2013.01); *H01L 29/786* (2013.01); *H01L 29/36* (2013.01)
USPC ........................................... 257/43

(58) Field of Classification Search
USPC ............ 257/43, E21.618, E21.633; 438/104, 438/158, 151; 349/139, 140
See application file for complete search history.

(56) References Cited

U.S. PATENT DOCUMENTS

| 7,675,133 B2 | 3/2010 | Burgener, II et al. |
| 2001/0012678 A1 | 8/2001 | Tanaka et al. |
| 2009/0081826 A1* | 3/2009 | Cowdery-Corvan et al. . 438/104 |

(Continued)

FOREIGN PATENT DOCUMENTS

| JP | 08-008063 A | 1/1996 |
| JP | 2000-277537 A | 10/2000 |

(Continued)

OTHER PUBLICATIONS

Shan, W. et al., "Oxygen induced band-gap reduction in $ZnO_xSe_{1-x}$ alloys", Phys. Stat. Sol., 2004, pp. 603-606, No. 3.

(Continued)

*Primary Examiner* — Wensing Kuo
*Assistant Examiner* — Herve Assouman
(74) *Attorney, Agent, or Firm* — Harness, Dickey & Pierce

(57) ABSTRACT

Transistors having sulfur-doped zinc oxynitride channel layers, and methods of manufacturing the same, include a ZnON channel layer with sulfur content ratio with respect to a zinc content of from about 0.1 at % to about 1.2 at %, a source electrode and a drain electrode respectively formed on a first region and a second region of the channel layer, a gate electrode corresponding to the channel layer, and a gate insulation layer between the channel layer and the gate electrode.

8 Claims, 6 Drawing Sheets

(56) References Cited

U.S. PATENT DOCUMENTS

| | | | |
|---|---|---|---|
| 2009/0152567 A1 | 6/2009 | Comerford et al. | |
| 2009/0260563 A1 | 10/2009 | Omichi et al. | |
| 2009/0309088 A1 | 12/2009 | Sakamoto | |
| 2010/0044702 A1* | 2/2010 | Urayama et al. | 257/43 |
| 2010/0301343 A1 | 12/2010 | Qiu et al. | |
| 2011/0128275 A1 | 6/2011 | Ueda et al. | |
| 2011/0141100 A1* | 6/2011 | Park et al. | 345/214 |
| 2011/0189818 A1 | 8/2011 | Shinn et al. | |

FOREIGN PATENT DOCUMENTS

| | | |
|---|---|---|
| JP | 2005-223231 A | 8/2005 |
| KR | 10-2010-0010978 A | 2/2010 |
| KR | 10-2011-0028386 A | 3/2011 |
| KR | 10-2011-0030694 A | 3/2011 |

OTHER PUBLICATIONS

Deulkar, S. et al., "Zinc Oxysulfide Thin Films Grown by Pulsed Laser Deposition", Journal of Electronic Materials, 2010, pp. 589-594, vol. 39, No. 5.

Hirose, H. et al., "Electronic Structure of Sr2Cu2ZnO2S2 Layered Oxysulfide with CuS Layers", Chem. Mater., 2002, pp. 1037-1041.

Ye, Y. et al., "High Mobility Amorphous Zinc Oxynitride Semiconductor Material for Thin Film Transistors", Jorunal of Applied Physics, 2009, pp. 074512-1 through 074512-8.

Vladimir L. Kuznetsov, et al., "Electronic conduction in amorphous and polycrystalline zinc-indium oxide films," *Applied Physics Letters*, vol. 97, pp. 262117-1-262117-3 (2010).

\* cited by examiner

TRANSISTOR HAVING SULFUR-DOPED ZINC OXYNITRIDE CHANNEL LAYER AND METHOD OF MANUFACTURING THE SAME

CROSS-REFERENCE TO RELATED APPLICATIONS

This application claims the benefit of priority under 35 U.S.C. §119(e) to Korean Patent Application No. 10-2012-0052212, filed on May 16, 2012 in the Korean Intellectual Property Office, the disclosure of which is incorporated herein by reference in its entirety.

BACKGROUND

1. Field

The present disclosure relates to transistors having sulfur-doped zinc oxynitride channel layers and methods of manufacturing the same.

2. Description of the Related Art

In electronic devices, transistors are widely used as switching devices or driving devices. Particularly, because thin film transistors (TFTs) may be fabricated on glass substrates or plastic substrates, TFTs are widely used in flat panel display devices (e.g., liquid crystal display (LCD) devices or organic light-emitting display devices).

To improve operating characteristics of transistors, a method of applying an oxide layer having high carrier mobility as a channel layer is being attempted. Such a method is mainly applied to a TFT for a flat panel display device.

An oxide channel layer may be a ZnO thin film. However, because carrier mobility of a ZnO thin film decreases at grain boundaries, an amorphous ZnO thin film may be used as a channel layer.

From among ZnO-based channel layers, a ZnON channel layer containing nitrogen is known for high carrier mobility.

However, characteristics of a transistor including a ZnON channel layer vary significantly according to nitrogen/oxygen ratios. Particularly, if nitrogen content increases, the ZnON channel layer may be easily oxidized in the atmosphere, and thus, carrier mobility may be deteriorated.

SUMMARY

The present disclosure relates to transistors having sulfur-doped zinc oxynitride channel layers and methods of manufacturing the same.

Provided are transistors with stabilized ZnON channel layers.

According to an example embodiment, there is provided a transistor including a ZnON channel layer with a sulfur (S) content ratio with respect to a zinc (Zn) content of from about 0.1 at % to about 1.2 at %; a source electrode and a drain electrode respectively on a first region and a second region of the ZnON channel layer; a gate electrode corresponding to the channel layer; and a gate insulation layer between the ZnON channel layer and the gate electrode.

A sulfur content may be from about 0.05 at % to about 0.6 at % in the ZnON channel layer.

A thickness of the ZnON channel layer may be from about 10 nm to about 150 nm.

The transistor may include a substrate. The gate electrode may be arranged between the substrate and the ZnON channel layer. The gate electrode may be on a same side of the substrate as the ZnON channel layer.

According to another example embodiment, there is provided a method of manufacturing a transistor including forming a gate electrode; forming a channel layer corresponding to the gate electrode; and forming a source electrode and a drain electrode respectively contacting a first region and a second region of the channel layer, wherein the forming a channel layer includes forming a ZnON layer containing sulfur, and the ZnON layer is doped with the sulfur such that a sulfur (S) content ratio of the ZnON layer with respect to a zinc (Zn) content of the ZnON layer is from about 0.1 at % to about 1.2 at %.

The forming a ZnON layer containing sulfur may include performing a reactive sputtering process.

The reactive sputtering process may include using a Zn target and a ZnS target.

The performing a reactive sputtering process includes supplying $O_2$ gas and $N_2$ gas as reactive gases.

Flux of the $O_2$ gas supplied during the reactive sputtering process may be from about 1 sccm to about 15 sccm, and flux of the $N_2$ gas supplied during the reactive sputtering process may be from about 20 sccm to about 150 sccm.

The performing a reactive sputtering process may include supplying an Ar gas for generating plasma.

Flux of the Ar gas supplied during the reactive sputtering process may be from about 1 sccm to about 50 sccm.

The method may further include annealing the transistor at a temperature from about 250° C. to about 350° C.

The method may further include providing a substrate. The gate electrode may be formed between the substrate and the channel layer. The gate electrode may be formed on a same side of the substrate as the channel layer.

The method may further include forming an etch stop layer on the channel layer. The etch stop layer may protect the channel layer during the forming a source electrode and a drain electrode.

According to yet another example embodiment, there is provided a transistor including a channel region formed of a metal oxynitride having a relative sulfur concentration ratio with respect to a relative metal concentration of about 0.1 at % to about 1.2 at %, a source electrode and a drain electrode over different ends of the channel region, a gate electrode corresponding to the channel region, and a gate insulation layer between the channel region and the gate electrode.

The metal oxynitride may be ZnON, and the relative sulfur concentration ratio may be with respect to a relative zinc concentration in the ZnON.

The ZnON may contain ZnS.

BRIEF DESCRIPTION OF THE DRAWINGS

Example embodiments will be more clearly understood from the following detailed description taken in conjunction with the accompanying drawings. FIGS. 1-5E represent non-limiting, example embodiments as described herein.

FIG. 1 is a sectional view of a transistor according to an example embodiment;

FIG. 2 is a graph showing S/Zn atomic ratio according to an increase of ZnS power via X-ray photoelectron spectroscopy;

FIG. 3 shows an I-V characteristic curve of a transistor including a sulfur-doped ZnON channel layer according to an example embodiment;

FIG. 4 shows a transistor according to another example embodiment; and

FIGS. 5A through 5E show a method of manufacturing a transistor according to an example embodiment.

DETAILED DESCRIPTION

Figure 1:
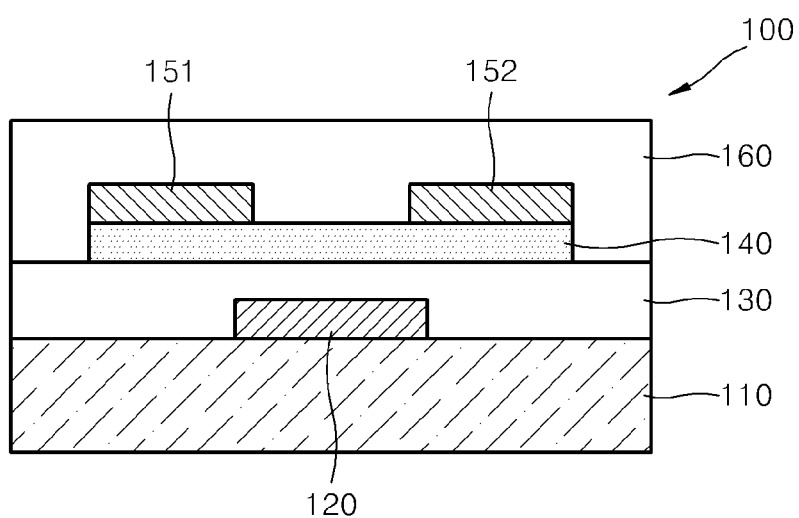

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to transistors having sulfur-doped zinc oxynitride channel layers and methods of manufacturing the same.

FIG. 1 is a sectional view of a transistor according to an example embodiment.

Referring to FIG. 1, a transistor 100 is a bottom-gate type thin film transistor (TFT) in which a gate electrode 120 is arranged below a channel layer 140. The gate electrode 120 may be arranged on a substrate 110. The substrate 110 may be a glass substrate or any of various other substrates used in common semiconductor device manufacturing processes, e.g., a plastic substrate, a silicon substrate, etc.

The gate electrode 120 may be formed of a common electrode material (a metal, a conductive oxide, etc.). A gate insulation layer 130 may be arranged on the substrate 110 to cover the gate electrode 120. The gate insulation layer 130 may include a silicon oxide layer, a silicon oxynitride layer, a silicon nitride layer, or any of various other material layers (e.g., a high-k material layer) having a greater dielectric constant than a silicon nitride layer. The gate insulation layer 130 may have a structure in which at least two from among a silicon oxide layer, a silicon oxynitride layer, a silicon nitride layer, and a high-k material layer are stacked.

The channel layer 140 may be arranged on the gate insulation layer 130. The channel layer 140 may be above the gate electrode 120. The channel layer 140 may be a sulfur-doped zinc oxynitride semiconductor. Content of sulfur with respect to Zn in the channel layer 140 may be from about 0.1 at % to about 1.2 at %. In the channel layer 140, content of sulfur may be from about 0.05 at % to about 0.6 at %.

The sulfur-doped ZnON channel layer 140 may be amorphous, wherein a small number of nanocrystals may exist therein.

A thickness of the channel layer 140 may be from about 10 nm to about 150 nm (e.g., from about 30 nm to about 100 nm). However, a range of the thickness of the channel layer 140 is not limited thereto.

A source electrode 151 and a drain electrode 152 may be arranged on the channel layer 140 to respectively contact a first region and a second region of the channel layer 140. The source electrode 151 may contact a first end of the channel layer 140, whereas the drain electrode 152 may contact a second end of the channel layer 140. The source electrode 151 and the drain electrode 152 may be formed of same material as the gate electrode 120. The source electrode 151 and the drain electrode 152 may be a single layer, or a multi-layer.

Shapes and locations of the source electrode 151 and the drain electrode 152 may vary. For example, the source electrode 151 may have a structure extending from the first end of the channel layer 140 onto a nearby portion of the gate insulation layer 130. Similarly, the drain electrode 152 may have a structure extending from the second end of the channel layer 140 onto a nearby portion of the gate insulation layer 130. Furthermore, the source electrode 151 and the drain electrode 152 may be arranged to contact regions other than both ends (that is, the first end and the second end) of the channel layer 140.

A passivation layer 160 that covers the channel layer 140, the source electrode 151, and the drain electrode 152 may be arranged on the gate insulation layer 130. The passivation layer 160 may be a silicon oxide layer, a silicon oxynitride layer, or a silicon nitride layer. Furthermore, the passivation layer 160 may have a structure in which at least two from among a silicon oxide layer, a silicon oxynitride layer, and a silicon nitride layer are stacked.

Thicknesses of the gate electrode 120, the gate insulation layer 130, the source electrode 151, the drain electrode 152, and the passivation layer 160 may be from about 50 nm to about 300 nm, from about 50 nm to about 400 nm, from about 10 nm to about 200 nm, from about 10 nm to about 200 nm, and from about 50 nm to about 1200 nm, respectively. However, such ranges of thicknesses are mere examples and may vary.

Because the sulfur-doped ZnON channel layer 140 contains ZnS having a larger band gap than ZnO or $Zn_3N_2$, thus the sulfur-doped ZnON channel layer 140 has more stable bonds. Because Zn—S bond is stronger than Zn—O bond, a transistor may be stabilized by doping a small amount of sulfur.

Table 1 shows surface resistance characteristics of a sulfur-doped ZnON thin film according to an example embodiment.

TABLE 1

| ZnS power (W) | Surface Resistance (as deposited) | Surface Resistance (200° C. annealing) |
|---|---|---|
| 0 | 3.4K | 4.2K |
| 15 | 4.2K | 7.8K |
| 30 | 46K | 1.2M |
| 45 | 1.4M | 34M |
| 60 | 55M | not available |
| 75 | not available | not available |

K and M denote $10^3$ and $10^6$, respectively.

The sulfur-doped ZnON thin film was formed by using a Zn target and a ZnS target on a glass substrate via a co-sputtering process. During the co-sputtering process, fluxes of supplied oxygen gas and nitrogen gas were 2 sccm and 100 sccm, respectively. The temperature of the substrate was maintained around 150° C. A voltage of 300 W was fixedly applied to the Zn target, whereas voltages applied to the ZnS target were changed in the order of 0 W, 15 W, 30 W, 45 W, 60 W, and 75 W to measure changes of sulfur content. The co-sputtering process was performed for 4 minutes and 10 seconds.

As shown in Table 1, as ZnS power increases, surface resistance Rs increases. Surface resistance Rs increases in both cases where the ZnON thin film was as deposited and where the ZnON thin film was annealed at 200° C. Particularly, surface resistance Rs increases more significantly by the annealing. Surface resistance of the sulfur-doped ZnON thin film tends to rapidly increase as sulfur content increases and is annealed.

As shown in Table 1, when ZnS power increased to about 60 W to about 75 W, surface resistance Rs increased significantly and was off the measuring range.

Figure 2:
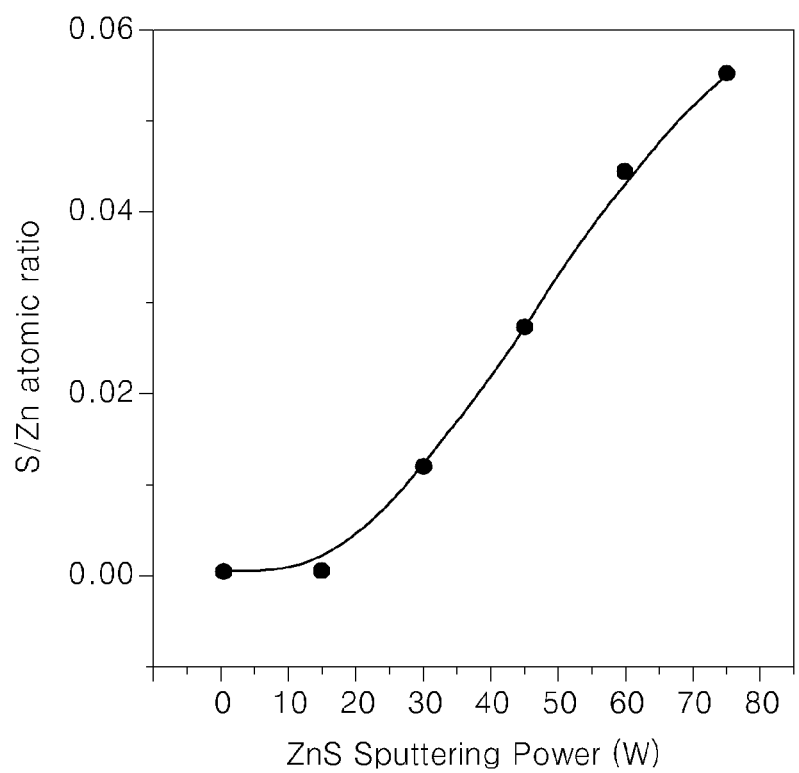

FIG. 2 is a graph showing S/Zn atomic ratio according to an increase of ZnS power via X-ray photoelectron spectroscopy.

The S/Zn atomic ratio is an atomic ratio of sulfur (S) with respect to Zn in a sulfur-doped ZnON thin film.

In FIG. 2, when powers applied to the ZnS target were 15 W, 30 W, and 45 W, S/Zn atomic ratios were 0%, 1.2%, and 2.8%, respectively. When power applied to the ZnS target was 15 W, no ZnS is detected from the thin film, because ZnS content was too low to be detected via X-ray photoelectron spectroscopy. However, as a result of SIMS measurement, when power applied to the ZnS target was 15 W, sulfur content was about half of that of a case in which power applied to the ZnS target was 30 W, and thus when power applied to the ZnS target is 15 W, S/Zn atomic ratio may be about 0.6%.

Figure 3:
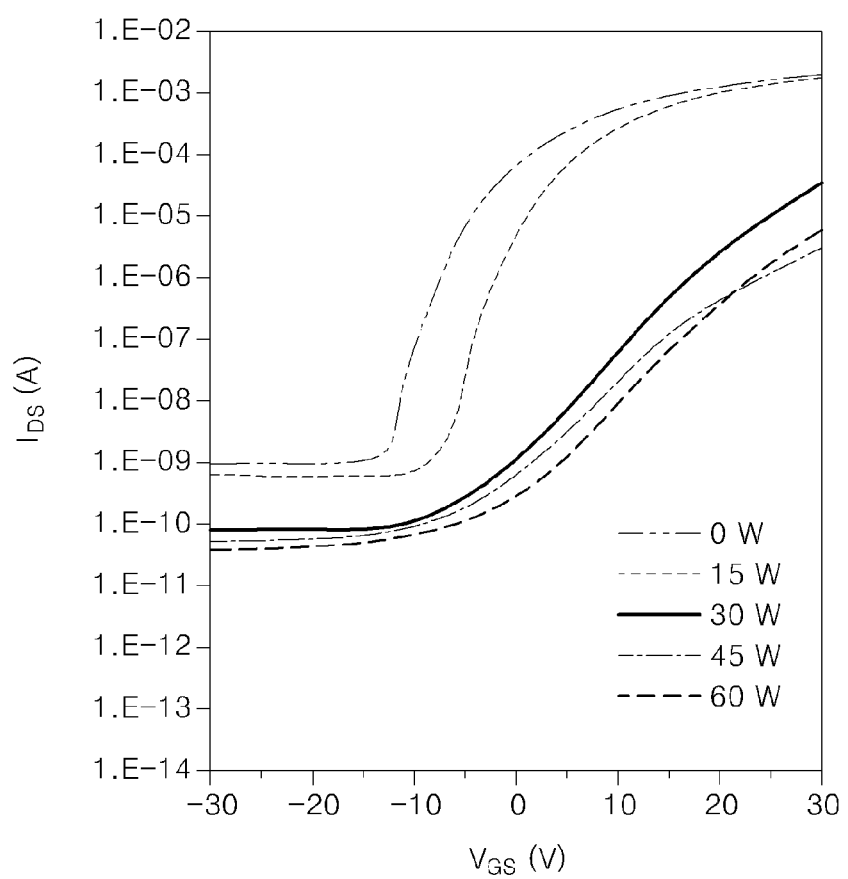

FIG. 3 shows an I-V characteristic curve of a transistor including a sulfur-doped ZnON channel layer according to an example embodiment.

For the experiment shown in FIG. 3, a bottom-gate type transistor having a structure as shown in FIG. 1 was prepared. A p-doped silicon substrate was used as a substrate, and a $SiO_2$ insulation layer having a thickness of 300 Å was formed on the substrate. A sulfur-doped ZnON channel layer having a thickness of 300 Å was formed on the insulation layer. A source electrode and a drain electrode having a thickness of 700 Å were formed on the channel layer by using aluminum. For convenience, the p-doped silicon substrate was used as a back gate.

The sulfur-doped ZnON channel layer is formed by using a Zn target and a ZnS target on the substrate via a co-sputtering process. During the co-sputtering process, fluxes of supplied oxygen gas and nitrogen gas were 2 sccm and 100 sccm, respectively. The temperature of the substrate was maintained around 150° C. A voltage of 300 W was applied to the Zn target, whereas voltages applied to the ZnS target were changed in the order of 0 W, 15 W, 30 W, 45 W, 60 W, and 75 W to change the sulfur content. The co-sputtering process was performed for 4 minutes and 10 seconds.

FIG. 3 shows a result measured after a transistor fabricated as described above was thermally treated at 250° C. for 1 hour and at 300° C. for 1 hour.

Referring to FIG. 3, as ZnS power increased, mobility of the transistor decreased, but threshold voltage of the transistor increased. Mobility of the transistor was about 43 $cm^2/Vs$ when sulfur was not doped, whereas mobility of the transistor increased to about 48 $cm^2/Vs$ when ZnS power was 15 W. However, when ZnS power was 30 W or higher, mobility of the transistor rapidly decreased to 5 $cm^2/Vs$ or below. A threshold voltage of the transistor was about −4V when sulfur was not doped. A threshold voltage of the transistor increased to about −2.4V when ZnS power was 15 W, and a threshold voltage of the transistor increased to about 18V or higher when ZnS power was 30 W or higher.

As shown in FIG. 3, a transistor including a ZnON channel layer exhibits good characteristics (e.g., stability and reliability) when sulfur concentration (S/Zn atomic %) is about 0.6 at % (that is, 15 W of ZnS power is applied), and characteristics of a transistor including a ZnON channel layer may be improved when sulfur concentration (S/Zn atomic %) is up to 1.2 at % (that is, 30 W of ZnS power is applied).

Because a sulfur-doped ZnON channel layer includes ZnS with a relatively large band gap and strong bond, the channel layer may be stabilized, and thus, a transistor including the sulfur-doped ZnON channel layer may be stabilized.

Figure 4:
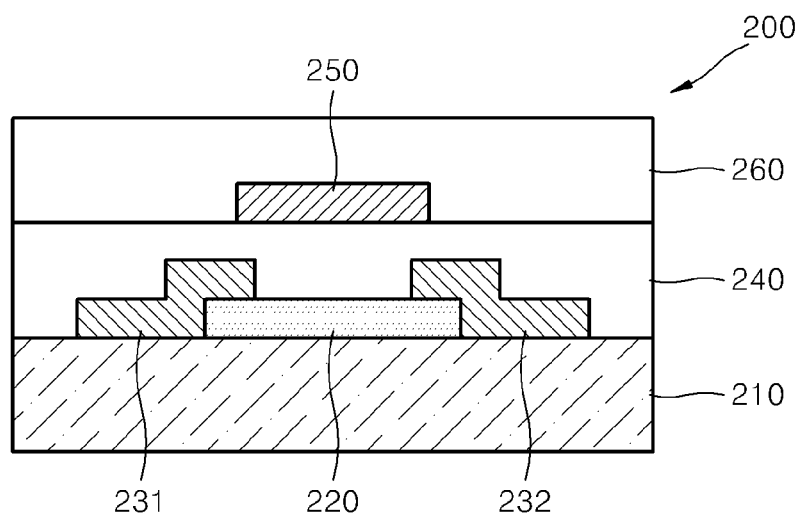

FIG. 4 shows a transistor according to another example embodiment.

In FIG. 4, a transistor 200 according to the present example embodiment is a top-gate type TFT in which a gate electrode 250 is arranged above a channel layer 220.

Referring to FIG. 4, the channel layer 220 is arranged on a substrate 210. The channel layer 220 may be a sulfur-doped zinc oxynitride semiconductor. Sulfur content ratio with respect to Zn in the channel layer 220 may be from about 0.1 at % to about 1.2 at %. In the channel layer 220, sulfur content may be from about 0.05 at % to about 0.6 at %.

The sulfur-doped ZnON channel layer 220 may be amorphous, wherein a small number of nanocrystals may exist therein.

A thickness of the channel layer 220 may be from about 10 to about 150 nm (e.g., from about 30 nm to about 100 nm). However, a range of thicknesses of the channel layer 220 may vary.

A source electrode 231 and a drain electrode 232 are arranged on the substrate 210 to respectively cover two opposite ends of the channel layer 220.

A gate insulation layer 240 may be arranged on the substrate 210 to cover the channel layer 220, the source electrode 231, and the drain electrode 232. The gate insulation layer 240 may include a silicon oxide layer, a silicon oxynitride layer, a silicon nitride layer, or any of various other material layers (e.g., a high-k material layer) having a greater dielectric constant than a silicon nitride layer. The gate insulation layer 240 may have a structure in which at least two from among a silicon oxide layer, a silicon oxynitride layer, a silicon nitride layer, and a high-k material layer are stacked.

The gate electrode 250 may be arranged on the gate insulation layer 240. The gate electrode 250 may be arranged above the channel layer 220 in correspondence to the channel layer 220. A passivation layer 260 may be arranged on the gate insulation layer 240 to cover the gate electrode 250. The passivation layer 260 may be a silicon oxide layer, a silicon oxynitride layer, or a silicon nitride layer. Furthermore, the passivation layer 260 may have a structure in which at least two from among a silicon oxide layer, a silicon oxynitride layer, and a silicon nitride layer are stacked.

Thicknesses of the gate electrode 250, the gate insulation layer 240, the source electrode 231, the drain electrode 232, and the passivation layer 260 may be from about 50 nm to about 300 nm, from about 50 nm to about 400 nm, from about 10 nm to about 200 nm, from about 10 nm to about 200 nm, and from about 50 nm to about 1200 nm, respectively. However, such ranges of thicknesses are mere examples and may vary.

Because the sulfur-doped ZnON channel layer 220 contains ZnS having a larger band gap than ZnO or $Zn_3N_2$, the sulfur-doped ZnON channel layer 220 has more stable bonds. Because a Zn—S bond is stronger than a Zn—O bond, a transistor may be stabilized by doping a small amount of sulfur into the ZnON channel layer 220.

FIGS. 5A through 5E show a method of manufacturing a transistor according to an example embodiment.

Although the present embodiment provides a method of manufacturing a bottom-gate type TFT, example embodiments are not limited thereto, and may be embodied in other forms know to those skilled in the art.

Figure 5A:
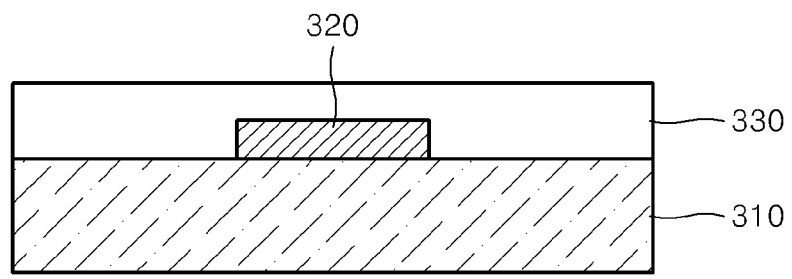

Referring to FIG. 5A, a gate electrode 320 may be formed on a substrate 310, and a gate insulation layer 330 may be formed on the substrate 310 to cover the gate electrode 320. The substrate 310 may be a glass substrate or any of various other substrates used in common semiconductor device manufacturing processes (e.g., a plastic substrate, a silicon substrate, etc.). The gate electrode 320 may be formed of a common electrode material (a metal, a conductive oxide, etc.). The gate insulation layer 330 may include a silicon oxide layer, a silicon oxynitride layer, a silicon nitride layer, or any of various other material layers (e.g., a high-k material layer) having a greater dielectric constant than a silicon nitride layer. The gate insulation layer 330 may have a structure in which at least two from among a silicon oxide layer, a silicon oxynitride layer, a silicon nitride layer, and a high-k material layer are stacked.

Figure 5B:
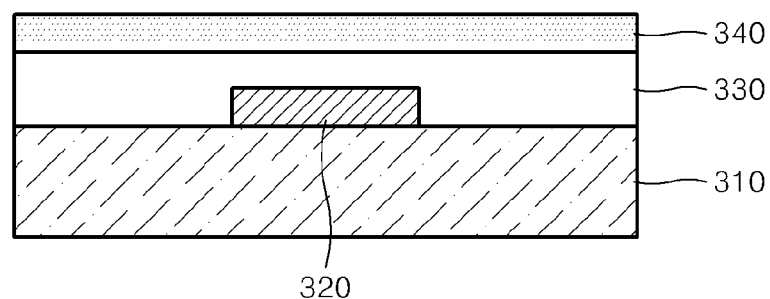

Referring to FIG. 5B, a channel semiconductor layer 340 may be formed on the gate insulation layer 330. The channel semiconductor layer 340 may be formed of an oxide semiconductor. The channel semiconductor layer 340 may be formed of a sulfur-doped ZnON-based semiconductor. For example, the channel semiconductor layer 340 may be formed of sulfur-doped ZnON. In the channel semiconductor layer 340, sulfur content ratio with respect to Zn may be from about 0.1 at % to about 1.2 at %. In the channel semiconductor layer 340, sulfur content may be from about 0.05 at % to about 0.6 at %.

The channel semiconductor layer 340 may be amorphous, wherein a small number of nanocrystals may exist therein.

A thickness of the channel semiconductor layer 340 may be from about 10 nm to about 150 nm (e.g., from about 30 nm to about 100 nm). However, a range of the thickness of the channel semiconductor layer 340 is not limited thereto.

The channel semiconductor layer 340 may be formed via a physical vapor deposition (PVD) process (e.g., a reactive sputtering process). The reactive sputtering process for forming the channel semiconductor layer 340 may be a co-sputtering process using a Zn target and a ZnS target. In this case, during the reactive sputtering process, $O_2$ gas and $N_2$ gas may be used as reactive gases. Here, flux of $O_2$ gas may be from about 1 sccm to about 15 sccm, whereas flux of $N_2$ gas may be from about 20 sccm to about 150 sccm. Furthermore, in the reactive sputtering process, Ar gas may further be used for plasma generation. In this case, flux of Ar gas may be from about 1 sccm to about 50 sccm. If plasma is generated by using Ar gas, deposition efficiency may be improved.

The reactive sputtering process may be performed at a temperature around 150° C. and under a pressure from about 0.4 Pa to about 0.8 Pa. However, the above-stated method for forming the channel semiconductor layer 340 is an example and various modifications may be made therein. For example, the channel semiconductor layer 340 may be formed in a process other than the reactive sputtering process (e.g., a metal organic chemical vapor deposition (MOCVD) process) using a sulfur precursor and a Zn precursor. Furthermore, the channel semiconductor layer 340 may be formed in any of various other processes (e.g., a chemical vapor deposition (CVD) process, an atomic layer deposition (ALD) process, or an evaporation process).

Figure 5C:
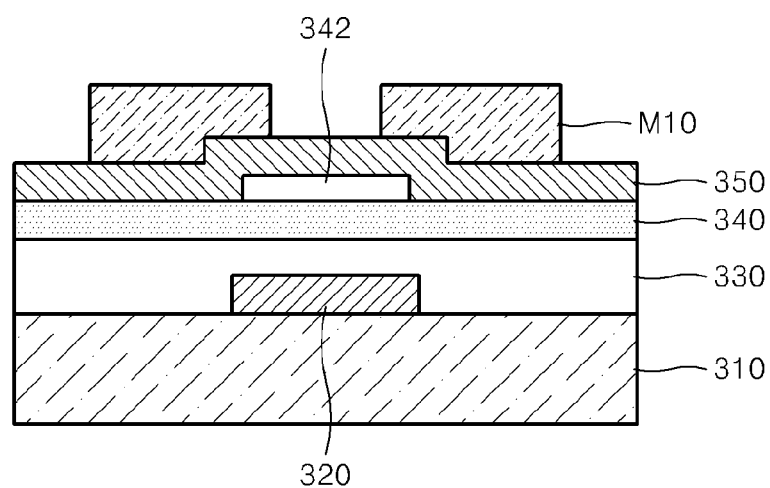

Referring to FIG. 5C, an etch stop layer 342 may be formed on the channel semiconductor layer 340. The etch stop layer 342 may be formed at a location corresponding to the gate electrode 320. The etch stop layer 342 may be formed of silicon oxide, silicon nitride, or an organic insulation material, for example.

A source/drain electrode conductive layer 350 that may be formed on the gate insulation layer 330 to cover the channel semiconductor layer 340 and the etch stop layer 342. The source/drain conductive layer 350 may be formed of the same material as the gate electrode 320. The source/drain conductive layer 350 may include a single layer or a multi-layer.

Next, a select (or, alternatively, predetermined) mask pattern M10 may be formed on the source/drain conductive layer 350. The mask pattern M10 may be formed to define regions in which a source electrode and a drain electrode are to be formed.

The source/drain conductive layer 350 and the channel semiconductor layer 340 may be etched (patterned) by using the mask pattern M10 as an etch barrier. A result of the etching (patterning) is shown in FIG. 5D.

Figure 5D:
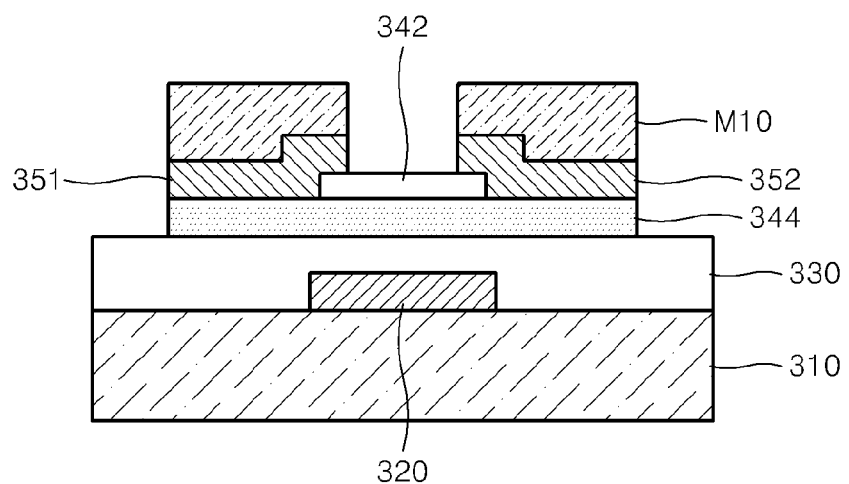

Referring to FIG. 5D, a channel layer 344 may be formed from the channel semiconductor layer 340, whereas a source electrode 351 and a drain electrode 352 may be formed from the source/drain conductive layer 350. During the etching (patterning), the etch stop layer 342 may protect a channel layer portion between the source electrode 351 and the drain electrode 352. However, the etch stop layer 342 may be alternatively formed.

Figure 5E:
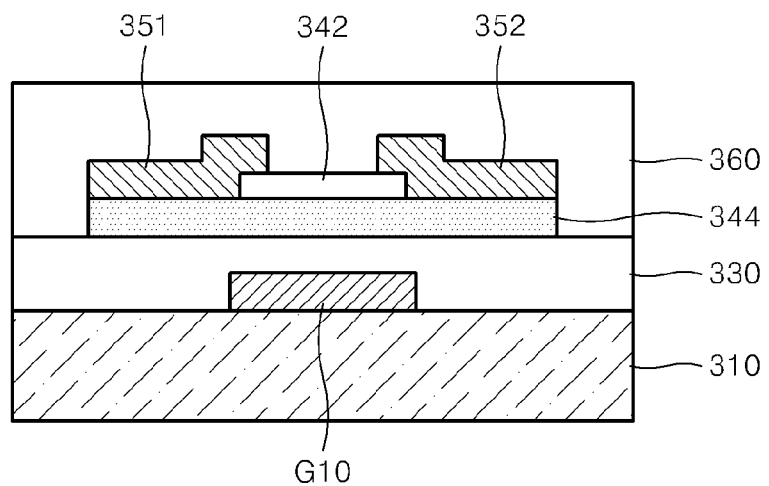

Referring to FIG. 5E, after the mask pattern M10 is removed, a passivation layer 360 may be formed to cover the etch stop layer 342, the source electrode 351, and the drain electrode 352. The passivation layer 360 may be a silicon oxide layer, a silicon oxynitride layer, or a silicon nitride layer, for example. Furthermore, the passivation layer 360 may have a structure in which at least two from among a silicon oxide layer, a silicon oxynitride layer, and a silicon nitride layer are stacked. A transistor formed as described above may be annealed at a set (or, alternatively, predetermined) temperature. The annealing may be performed at a temperature from about 250° C. to about 350° C., for example.

The above-described method described with respect to FIGS. 5A through 5E is an example of methods of manufacturing a transistor as shown in FIG. 1. The manufacture of a transistor as shown in FIG. 4 is obvious to one of ordinary skill in the art from the method shown in FIGS. 5A through 5E, and thus, a detailed description thereof is omitted.

As described above, according to the above example embodiments, when a ZnON channel layer is doped with a small amount of sulfur, a transistor having the ZnON channel layer may have high mobility and the oxidation of the ZnON channel is prohibited. Furthermore, because the ZnON channel layer is stabilized, a highly reliable and stabilized transistor may be embodied.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A transistor, comprising:
a ZnON channel layer with a sulfur (S) content ratio with respect to zinc (Zn) content of from about 0.1 at % to about 1.2 at %;
a source electrode and a drain electrode respectively on a first region and a second region of the ZnON channel layer;
a gate electrode corresponding to the channel layer; and
a gate insulation layer between the ZnON channel layer and the gate electrode.

2. The transistor of claim 1, wherein a sulfur content is from about 0.05 at % to about 0.6 at % in the ZnON channel layer.

3. The transistor of claim 1, wherein a thickness of the ZnON channel layer is from about 10 nm to about 150 nm.

4. The transistor of claim 1, further comprising:
a substrate,
the gate electrode being between the substrate and the ZnON channel layer.

5. The transistor of claim 1, further comprising:
a substrate,
the gate electrode being on a same side of the substrate as the ZnON channel layer.

6. A transistor, comprising:
a channel region formed of a metal oxynitride having a relative sulfur concentration ratio with respect to a relative metal concentration of about 0.05 at % to about 1.2 at %;
a source electrode and a drain electrode over different ends of the channel region;
a gate electrode corresponding to the channel region; and
a gate insulation layer between the channel region and the gate electrode.

7. The transistor of claim 6, wherein,
the metal oxynitride is ZnON, and
the relative sulfur concentration ratio is with respect to a relative zinc concentration in the ZnON.

8. The transistor of claim 7, wherein the ZnON contains ZnS.

* * * * *